US007548473B2

(12) United States Patent
Chen et al.

(10) Patent No.: US 7,548,473 B2
(45) Date of Patent: Jun. 16, 2009

(54) APPARATUS AND METHODS FOR DETERMINING MEMORY DEVICE FAULTS

(75) Inventors: Qikai Chen, West Layfayette, IN (US); Swarup Bhunia, Midnapore (IN); Hamid Mahmoodi, West Lafayette, IN (US); Kaushik Roy, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 295 days.

(21) Appl. No.: 11/404,667

(22) Filed: Apr. 14, 2006

(65) Prior Publication Data

US 2007/0242538 A1    Oct. 18, 2007

(51) Int. Cl.
*G11C 7/00* (2006.01)
(52) U.S. Cl. ................. 365/201; 365/200; 365/207; 365/189.07
(58) Field of Classification Search .......... 365/201, 365/200, 207, 189.07
See application file for complete search history.

(56) References Cited

U.S. PATENT DOCUMENTS

| | | | | |
|---|---|---|---|---|
| 5,179,536 A * | 1/1993 | Kasa et al. | ............ | 365/200 |
| 5,311,473 A * | 5/1994 | McClure et al. | ............ | 365/201 |
| 5,519,712 A * | 5/1996 | Shu et al. | ............ | 365/201 |
| 5,539,694 A * | 7/1996 | Rouy | ............ | 365/189.09 |
| 5,666,324 A * | 9/1997 | Kosugi et al. | ............ | 365/233.11 |
| 6,122,710 A * | 9/2000 | Kumar et al. | ............ | 711/118 |
| 6,418,067 B1 * | 7/2002 | Watanabe et al. | ............ | 365/200 |
| 6,757,209 B2 * | 6/2004 | Mak et al. | ............ | 365/230.02 |
| 7,130,236 B2 * | 10/2006 | Rajwani et al. | ............ | 365/208 |
| 7,263,010 B2 * | 8/2007 | Iwai et al. | ............ | 365/200 |
| 7,266,036 B2 * | 9/2007 | Hayashi et al. | ............ | 365/230.03 |
| 7,277,307 B1 * | 10/2007 | Yelluru | ............ | 365/49.1 |
| 7,382,637 B1 * | 6/2008 | Rathnavelu et al. | ............ | 365/49.17 |
| 7,385,863 B2 * | 6/2008 | Nishihara et al. | ............ | 365/200 |
| 2002/0141259 A1 * | 10/2002 | Mak et al. | ............ | 365/201 |
| 2003/0081449 A1 * | 5/2003 | Beucler | ............ | 365/154 |
| 2004/0022115 A1 * | 2/2004 | Park et al. | ............ | 365/226 |

OTHER PUBLICATIONS

Chen, Q. et al., "Modeling and testing of SRAM for new failure mechanisms due to process variations in nanoscale CMOS," Proceedings of the 23rd IEEE VLSI Test Symposium, May 2005, pp. 292-297.
Chen, Q. et al., "Efficient Testing of SRAM with optimized march sequences and novel DFT technique for emerging failures due to process variations," IEEE Transactions on VLSI Systems, Nov. 2005, vol. 13, No. 11, pp. 1286-1295.
Anne Meixner, et al., Weak Write Test Mode: An SRAM Cell Stability Design for Test Technique, Proceedings of the IEEE International Test Conference on Test and Design Validity, 1996, pp. 309-318, IEEE, Washington, DC, USA.

* cited by examiner

*Primary Examiner*—Tuan T. Nguyen
(74) *Attorney, Agent, or Firm*—Barnes and Thornburg LLP

(57) ABSTRACT

A test circuit used for determining a fault in a memory device. The test circuit includes a read circuit configured to read memory cell contents in a memory device at a first time instant and second time instant. The test circuit includes a comparator that compares the contents at the first and second time instants. If the contents are different from one another, the comparator indicates that a fault has occurred. Test methods are also used to determine if a fault has occurred in a memory cell.

19 Claims, 6 Drawing Sheets

US 7,548,473 B2

APPARATUS AND METHODS FOR DETERMINING MEMORY DEVICE FAULTS

BACKGROUND

The present disclosure relates generally to memory device testing, and more specifically to memory device test circuits and methods used for determining memory cell faults.

Memory devices, such as static random access memory (SRAM) devices, may experience failure due to issues, such as, process variations. Process variations can occur due to the difficulty in scaling devices, specifically, from random dopant fluctuations resulting in parameter mismatches for transistors used in memory devices. These problems can result in various types of memory cell faults, such as deceptive read destructive faults and low supply data retention faults, for example. Test methods and circuits can be used to detect these faults resulting from failure mechanisms in the memory devices.

SUMMARY

The present invention comprises one or more of the features recited in the appended claims and/or the following features which, alone or in any combination, may comprise patentable subject matter. A test circuit may be configured to determine when a fault has occurred in a memory device having a number of memory cells, each capable of storing data content.

The test circuit may comprise a read circuit. The read circuit may be configured to read the data content of a memory cell. The test circuit may include a first and second output. The first output may be configured to produce a signal indicative of the memory cell content at a first time instant. The second output may be configured to produce a signal indicative of the memory cell content at a second time instant later than the first. The test circuit may further comprise a comparator. The comparator may be configured to receive and process the first and second outputs of the read circuit and produce a signal indicative of whether a memory cell fault has occurred.

The read circuit may comprise first and second sense amplifier circuits. The first and second sense amplifier circuits may each have first inputs electrically connected to a first bit line of the memory device. The first and second sense amplifiers may each have second inputs connected to a second bit line of the memory device. The first and second sense amplifiers may each have a third input configured to receive a first sense enable signal and second sense enable signal, respectively. The first sense amplifier may have a first output defining the first output of the circuit and a second output. The second sense amplifier may have a second output defining the second output of the read circuit.

The memory device may comprise a number of memory cells arranged into "rows" and "columns," such that each row, or memory address, represents a "word" of bits and each column represents a bit location for each word. Each memory cell in the memory device may be identified by a particular word (row) and bit location (column). The memory device may comprise a number of test circuits such that each bit location includes a corresponding test circuit. Each test circuit may be associated with a first and second bit line corresponding to a particular row. Each read circuit of each test circuit may comprise a first and second transistor. The first transistor of each test circuit may have a drain electrically connected to the corresponding first bit line and a gate electrically connected to the first output of the corresponding first sense amplifier. The second transistor may have a drain electrically connected to the second output of the corresponding first sense amplifier. The memory device may include a third transistor. The third transistor may have a source electrically connected to a voltage source, a gate configured to receive a read test enable signal indicating when a read test is to be performed on a memory cell, and an output electrically connected to the sources of the first and second transistors of each test circuit.

The memory device may be a static random access memory (SRAM) device.

The memory device may further comprise a timing circuit. The timing circuit may comprise a read test enable line configured to provide the read test enable signal. The memory device may also comprise a system clock signal line for providing a system clock signal. The timing circuit may also comprise a first NAND gate having an input defined as the read test enable line and another input defined as the system clock signal line. The output of the first NAND gate may be electrically connected to the input of a first inverter and the output of the first inverter may be electrically connected to an input of a first OR gate. The first OR gate may have another input electrically connected to the system clock signal line. The output of the first OR gate may be electrically connected to the input of a second inverter. The output of the first OR gate may be configured to produce a "local" clock signal. The output of the second inverter may be electrically connected to the input of third inverter. The output of the third inverter may be defined as the first sense enable line.

The output of the first OR gate may be electrically connected to an input of a second NAND gate. The second NAND gate may have another input defined as the read test enable line. The output of the NAND gate may be defined as the second sense enable signal.

The timing circuit may further comprise a second OR gate having an input electrically connected to the output of the first OR gate. The timing circuit may further comprise a fourth inverter having an input electrically connected to the output of the first OR gate. The fourth inverter may have an output electrically connected to the input of a fifth inverter. The fifth inverter may have an output electrically connected to another input of the second OR gate. The output of the second OR gate may be configured to produce a signal indicating that the memory device bit lines are to be charged in preparation of another word line being accessed.

The timing circuit may further comprise a WORD line driver circuit for each WORD line of the memory device configured to generate a signal to each memory cell of an associated WORD line for access to the memory cell. Each WORD line driver circuit may comprise a first, second, third, and fourth transistor. The first and second transistors each have an input electrically connected to a voltage source. The first transistor has another input electrically connected to the output of the first OR gate of the timing circuit. The first and second transistors may each have an output coupled to an input of an inverter.

The third transistor may have an input electrically connected to the input of the inverter. The third transistor may have another input configured for receiving a signal from a row address decoder. The row address decoder indicates that memory cells corresponding to a particular word are to be accessed. The third transistor may have an output electrically connected to an input of the fourth transistor. The fourth transistor may have another input electrically connected to the output of the second OR gate and an output electrically connected to ground.

The output of the inverter of each WORD line driver circuit may be configured to generate a signal indicating a particular word, or "row" of memory cells, is to be accessed for reading. The output of the inverter may also be electrically connected to another input of the second transistor.

A first method for indicating a fault in a memory cell of a memory device may have a step comprising of writing a specific bit to each memory cell in a memory device. The first method may also comprise a step of performing a first test at each memory address in a first order, such as ascending memory address order, for example. The first test may include reading the contents of each memory cell sharing a common memory address with a respective test circuit to determine if a fault is present in any memory cell and indicating such, then writing another specific bit to each memory cell of the common memory address.

The first method may comprise another step of performing a second test for each memory address in the first order order. The second test may include reading the contents of each memory cell sharing a common memory address with a respective test circuit to determine the memory cells' contents and indicating any present memory cell faults, then writing another specific bit to each memory cell of the common memory address.

The first method may comprise another step of performing the first test on each memory address in a second order, such as descending memory address order, for example. The first method may comprise another step of pausing for a first predetermined amount of time. The first method may comprise another step of performing a third test on each memory address in the second order. The third test may include a first and second reading of each memory cell having a common memory address. Each reading may include determining the contents of the memory cells and indicating any present faults. The second read may be followed by writing a specific bit to each of the memory cells. The first method may comprise another step of pausing for second predetermined amount of time.

The first method may comprise another step of performing a fourth test step at each memory address in the first or second order. The fourth test step may include a first and second reading of each memory cell having a common memory address. Each reading may include determining the contents of the memory cells and indicating a present fault in any of the memory cells.

The test circuit may be used for reading the memory cell contents to determine the contents and indicating a memory cell fault in the first method. Using the test circuit, the third and fourth tests of the first method may each include a single read, as opposed to a first and second, for determining the memory cells' contents and indicating a present fault.

A second method may comprise a first step of writing a specific bit to each memory cell of a memory device in a first order such as descending address order, for example. The second method may comprise another step of pausing for a first predetermined amount of time.

The second method may comprise another step of performing a first test at each memory address in a second order. The first test may include a first reading of the memory cells having a common memory address to determine the memory cells' contents and indicating a present fault in any of the memory cells, then writing a specific bit to each memory cell. The first test may further include writing another specific bit to each memory cell and a second reading to determine the memory cells' contents and indicating a present fault in any of the memory cells. The second method may comprise another step of pausing for a predetermined amount of time.

The second method may comprise another step of performing the second test in reverse sequence at each memory address in the second order for each memory cell having a common memory address. The second method may further comprise another step of performing a third test at each memory address, which can include reading the contents of each memory cell having a common memory address to determine the contents and indicating a present fault.

BRIEF DESCRIPTIONS OF THE FIGURES

FIG. 7(*b*) is a representation of an illustrative embodiment of another memory device testing algorithm.

DETAILED DESCRIPTION OF THE DRAWINGS

Figure 1:
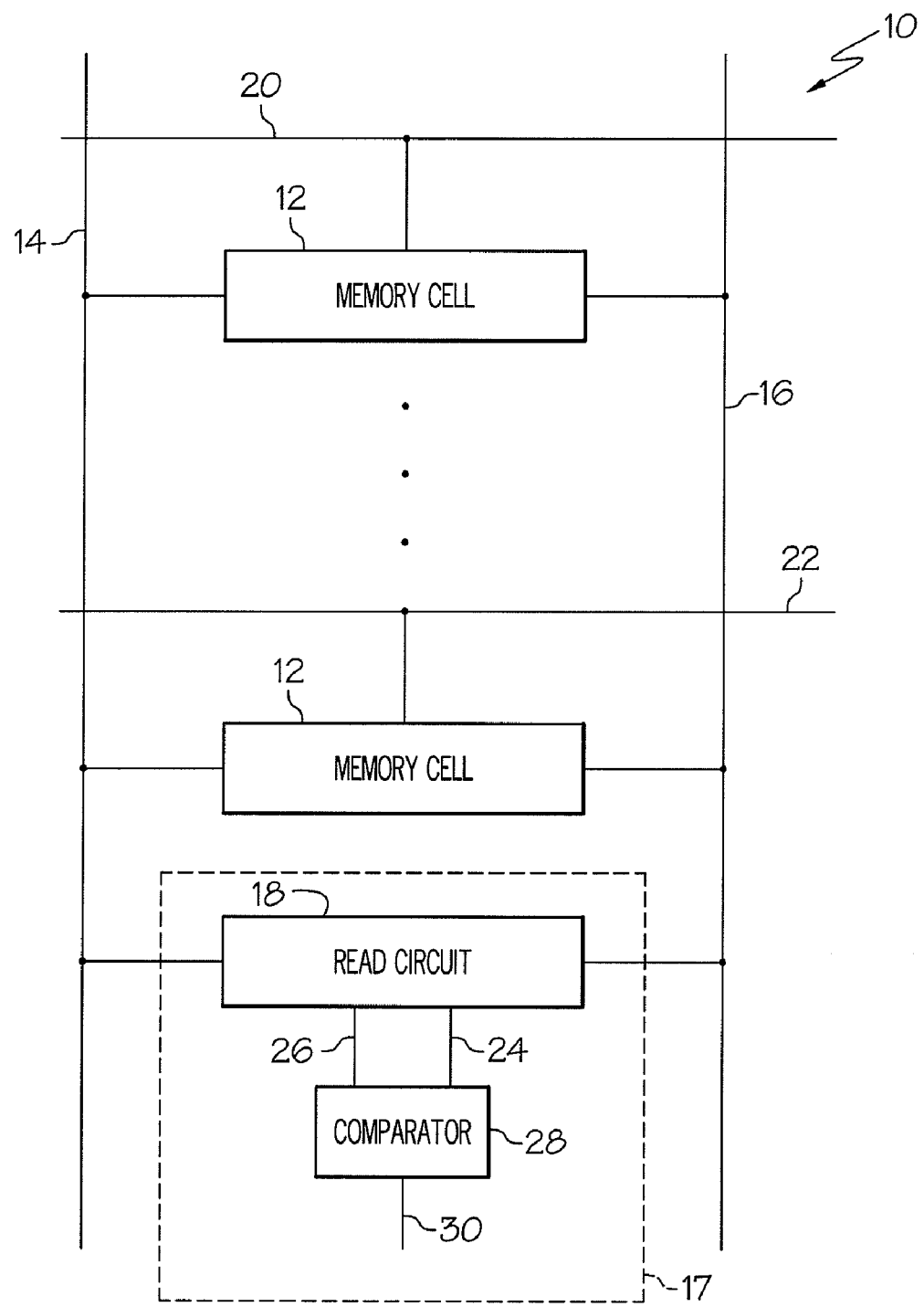
FIG. 1 is a schematic of an illustrative embodiment of a memory device including a test circuit.

While the concepts of the present disclosure are susceptible to various modifications and alternative forms, specific exemplary embodiments thereof have been shown by way of example in the drawings and will herein be described in detail. It should be understood, however, that there is no intent to limit the concepts of the present disclosure to the particular forms disclosed, but on the contrary, the intention is to cover all modifications, equivalents, and alternatives falling within the spirit and scope of the disclosure.

Referring now to FIG. 1, an illustrative embodiment of a portion of a memory device 10 is shown. Although the memory device 10 illustrated in FIG. 1 is a static random access memory (SRAM) device, it should be appreciated that the methods and devices disclosed herein are applicable to other types of memory devices, applications, and implementations. Memory device 10 illustratively includes a number of memory cells 12. Particularly, FIG. 1 illustrates a "column" of a memory device, which represents one bit position in a "word" of bit data. Memory device 10 includes BIT line 14 and notBIT line 16, which are shown to each be coupled to each memory cell 12. In this illustrative embodiment, each memory cell 12 is electrically connected to a WORD line 20, 22. WORD lines 20, 22 provide a signal to a corresponding memory cell 12, which indicates that a particular "row" or "word" of memory cells is to be accessed for a read or write operation.

Memory device 10 illustratively comprises a test circuit 17, which includes a read circuit 18 and a comparator 28. Read circuit 18 is electrically connected to bit lines 14, 16. Outputs 24, 26 of the read circuit 18 are electrically connected to corresponding inputs of the comparator 28, which has an output 30.

During operation, a particular memory cell 12 holding data, such as a logic "1" or "0," may have data read when a WORD line 20, 22 provides a logic "high" signal. This allows the contents of a memory cell 12 to be transmitted along bit lines 14, 16 to read circuit 18. Read circuit 18 can be configured to provide an output 24 indicative of the contents of memory cell 12 at a first time instant. Output 26 can be configured to provide an output indicative of the contents of a memory cell 12 at a second time instant later than the first. Outputs 24, 26 are both received by comparator 28 for comparison. This allows both outputs representing contents of a memory cell 12 at two distinct time instants to be compared by comparator 28, which provides a signal indicating a fault in the memory cell 12 being accessed. For example, if memory cell 12 associated with WORD line 20 contained a logic "1," when accessed to be read by read circuit 18, output 24 can provide an output indicative of the contents of memory cell 12. If a fault occurs, the memory cell 12 being read may have its contents changed in error after output 24 indicates the content. Output 26 will provide an output. Comparator 28 compares the "1" provided by output 24 and the "0" provided by output 26 and will provide a signal, such as a logic high, indicating memory cell 12 is faulty.

Figure 2:
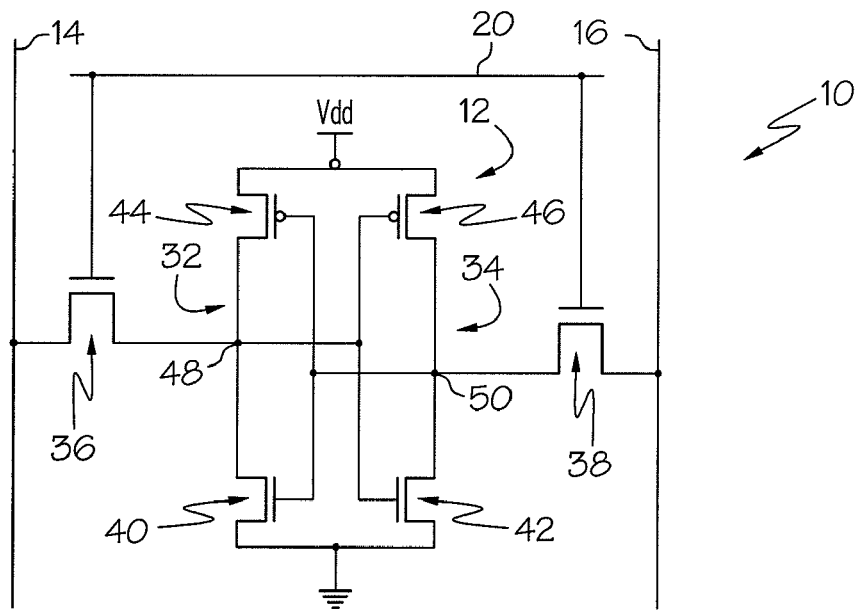
FIG. 2 is a schematic of an illustrative embodiment of a memory device.

FIG. 2 shows one illustrative embodiment of one of the memory cells 12. Although memory cell 12 is illustrated in FIG. 2 as a six-transistor memory cell, the methods and devices disclosed herein may be applicable to other types of memory cells including, but not limited to, four transistor memory cells.

The memory cell 12 includes two cross-coupled inverters 32, 34 and access transistors 36, 38. The inverters 32, 34 include two transistors each, one n-type and one p-type. In particular, each inverter 32, 34 includes a n-type driver transistor 40, 42, and p-type transistor 44, 46, respectively. Illustratively, the transistors included in each of the inverters 32, 34 and the access transistors 36, 38 are metal-oxide semiconductor field effect transistors (MOSFET's), but in other embodiments other types of transistors may be used. The inverters 32, 34 are electrically connected on a supply side to a power supply voltage, Vdd. The inverters 32, 34 are also each electrically each coupled to the drains of the access transistors 36, 38. The source of the access transistor 36 is electrically connected to a BIT line 14 and the source of the access transistor 38 is electrically connected to a notBIT line 16. The gates of access transistors 36, 38 are electrically connected to a WORD line 20.

In operation, bit data, such as a logic "0" or "1," is stored in the memory cell 12 in the form of voltages at nodes 48, 50. The bit data may be read or overwritten via the access transistors 36, 38. To do so, WORD line 20 provides a voltage signal to bias, or turn on, the access transistors 36, 38. Data can then be transmitted through to the BIT line 14 and notBIT line 16 to store the bit data in the memory cell 12. Alternatively, bit data previously stored in memory cell 12 may be read using the bit lines 14, 16 in a similar manner.

Figure 3:
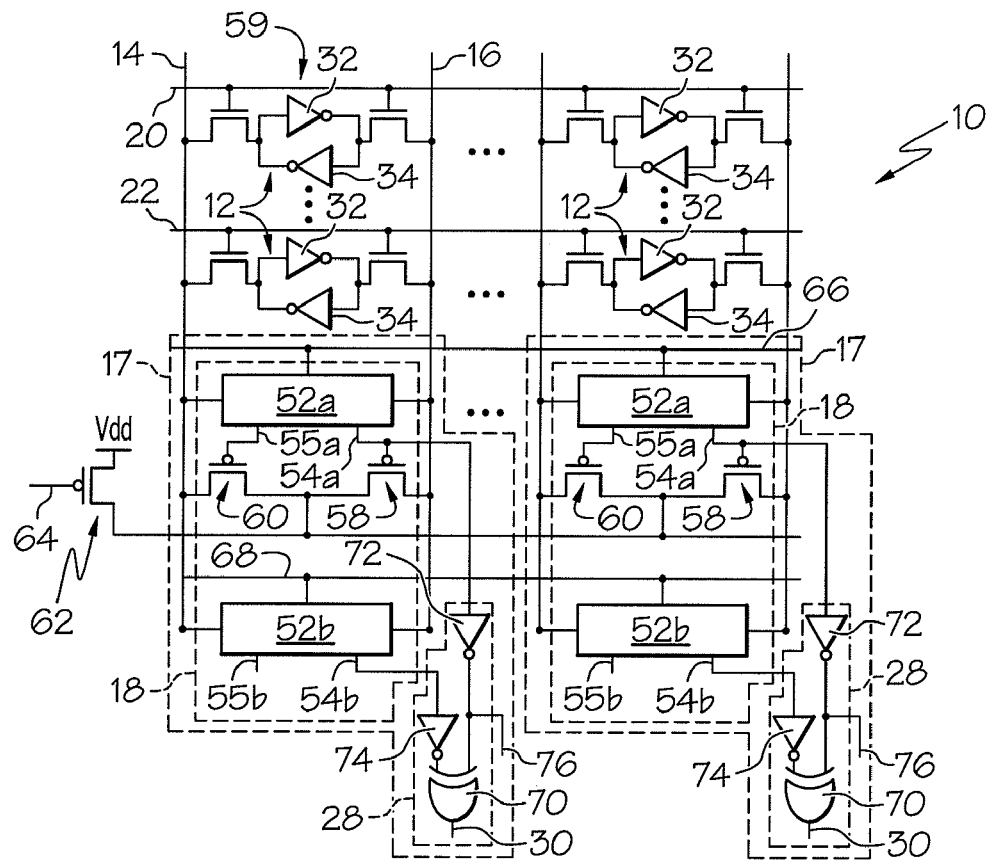
FIG. 3 is another schematic of an illustrative embodiment of a memory device.

FIG. 3 illustratively shows a portion of memory device 10 having a number of test circuits 17 configured to detect faults that may occur in memory cells 12. In this illustrative embodiment, memory device 10 is shown to include a number of memory cells 12 arranged into "words" and bit locations with each word comprising a "row," or memory address, of memory cells and the bit locations being arranged by "column." Typically, memory addresses are sequentially ordered so that the rows of memory cells 12 may be indexed and referenced, such as ranging from a highest to lowest address, for example. Each memory cell 12 in a "word" represents a bit location and can store one bit, a logic "1" or "0," of data as discussed regarding FIG. 1. FIG. 3 illustratively shows two "row" and "column" portions, each row having an associated WORD line 20, 22. One test circuit 17 is used per column since only one word, and thus one memory cell 12 per bit location, is accessed at a time for performing a read or write operation.

Figure 4:
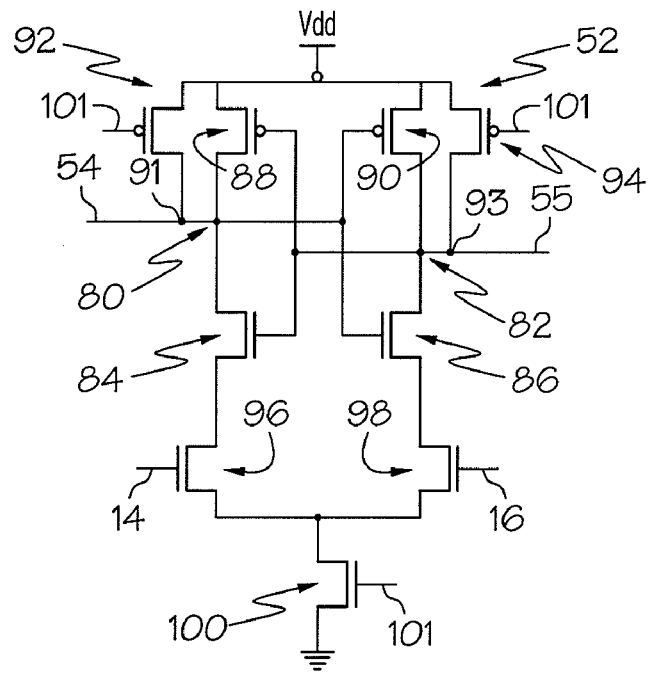
FIG. 4 is a schematic of an illustrative embodiment of a sense amplifier circuit.

In this illustrative embodiment each test circuit 17 includes two sense amplifiers 52a, 52b, an illustrative embodiment of which is shown in FIG. 4. Sense amplifiers 52a-b are circuits configured to "sense" the contents of a memory cell, such as memory cell 12. Each sense amplifier 52a-b has a first output 54a-b, respectively, and a second output 55a-b, respectively, with each output pair of sense amplifiers 52a-b providing a mutually exclusive logic "1" and "0" indicating the contents of a memory cell 12. Outputs 54a-b correspond to outputs 24, 26 shown in FIG. 1.

Each test circuit 17 includes transistors 58, 60, which are p-type in this illustrative embodiment. Referring to column 59, which is exemplary of each bit location of each word of memory device 10, the inputs of both sense amplifiers 52a-b are bit lines 14, 16, electrically connected in the same manner as that shown in FIG. 3. A gate terminal of transistor 58 is electrically connected to output 54a of sense amplifier 52a. A drain terminal of transistor 58 is electrically connected to notBIT line 16. A gate terminal of transistor 60 is electrically connected to output 55a. A drain terminal of transistor 60 is electrically connected to BIT line 14 of bit location 59.

Memory device 10 is shown to include transistor 62, which is p-type in this illustrative embodiment. Transistors 58, 60 of each test circuit 17 have a respective source terminal electrically connected to the drain terminal of transistor 62. A source terminal of transistor 62 is connected to voltage source Vdd. A gate terminal of transistor 62 is electrically connected to notREAD test line 64, which provides a low signal when a read operation is desired, which turns on p-type transistor 62.

Sense amplifiers 52a-b of each test circuit 17 are electrically connected to first sense enable line 66 and second sense enable line 68, respectively. Enable lines 66, 68 provide a logic high and low signals to sense amplifiers 52a, 52b, respectively. These signals enable sense amplifiers 52a, 52b when providing a logic "1." Outputs 54a-b of each test circuit 17 are electrically connected to a respective comparator 28. Comparator 28 includes an XOR gate 70 with its inputs electrically connected to the outputs of inverters 72, 74. The inputs of inverters 72, 74 are electrically connected to output 54a-b, respectively, of test circuit 17.

FIG. 3 shows each bit location to include a data line 76. Data lines 76 communicate the bit data found in memory cell 12 in the form of a logic "1" or "0." For example, if a memory cell 12 of bit location contains a logic "1," BIT line 14 will be at a higher voltage than notBIT line 16. These voltages are input into sense amplifier 52a, with output 54a providing a logic "0." Inverter 72 will invert output 54a to a logic "1." This configuration allows a higher voltage on the BIT lines relative to the notBIT lines during transmission to correspond to a logic "1" at data lines 76 being stored in memory cells 12 and a higher voltage on the notBIT lines relative to the BIT lines to correspond to a logic "0" on data lines 76.

Referring now to FIG. 4, an illustrative schematic of a sense amplifier 52 that may be used in a test circuit 17 to serve as sense amplifier 52a or 52b. It is to be appreciated that other circuit configurations may be used other than that illustrated in FIG. 4. In this illustrative embodiment, the sense amplifier 52 includes cross-coupled inverters 80, 82. Each inverter 80, 82 illustratively includes an n-type transistor 84, 86 and a p-type transistor 88, 90, respectively. Sense amplifier 52 also includes precharge transistors 92, 94, which are p-type transistors in this illustrative embodiment.

Transistors 96, 98 each have their respective sources electrically connected to an inverter 80, 82, respectively, and their respective gates electrically connected to BIT lines, such as BIT line 14 and notBIT line 16, respectively, in this illustrative embodiment. Transistors 92, 94, 100 each have their respective gates electrically connected to enable line 101. Illustratively, the transistors included in sense amplifier 52a are metal-oxide semiconductor field effect transistors (MOSFET's), but in other embodiments other types of transistors may be used.

In operation, sense enable line 101 provides a logic "0," which keeps transistor 100 turned off, but turns on transistors 92, 94. This charges nodes 91, 93 to voltage Vdd. BIT line 14 and notBIT line 16 are precharged to Vdd as well, and when data is read from a memory cell 12, one of the bit line 14, 16 voltages will drop from Vdd, which corresponds to the respective node 48, 50 maintaining a substantially zero voltage at the time of reading. These bit line 14, 16 voltages are provided to gate terminals of transistors 96, 98, respectively. When enable line 101 provides a voltage of Vdd, or a logic "1," transistor 100 turns on, providing a path for nodes 91, 93 to discharge, while turning off transistors 92, 94 to isolate nodes 91, 93 from Vdd. The bit line 14, 16 providing a higher voltage to transistor 96, 98, respectively, will have the voltage at the respective node 91, 93, discharge faster.

The cross-coupled inverters 36, 38 will operate to such that the outputs 54, 55, of sense amplifier 52 are exclusively at Vdd and substantially zero volts when one of the nodes 91, 93 drops to a voltage level allowing the cross-coupled inverters 80, 82 to operate. For example, output 54 will provide a voltage of Vdd, or a logic "1," when notBIT line 16 provides a higher voltage than BIT line 14 and will provide a logic "0" when BIT line 14 provides a higher voltage. This allows the contents in memory cell 12 to be communicated along BIT line 14 and notBIT line 16 and subsequently outputted in the form of a logic "1" and "0" from sense amplifier 52 allowing the data content of the memory cell to be clearly read as discussed regarding FIG. 3.

Figure 5:
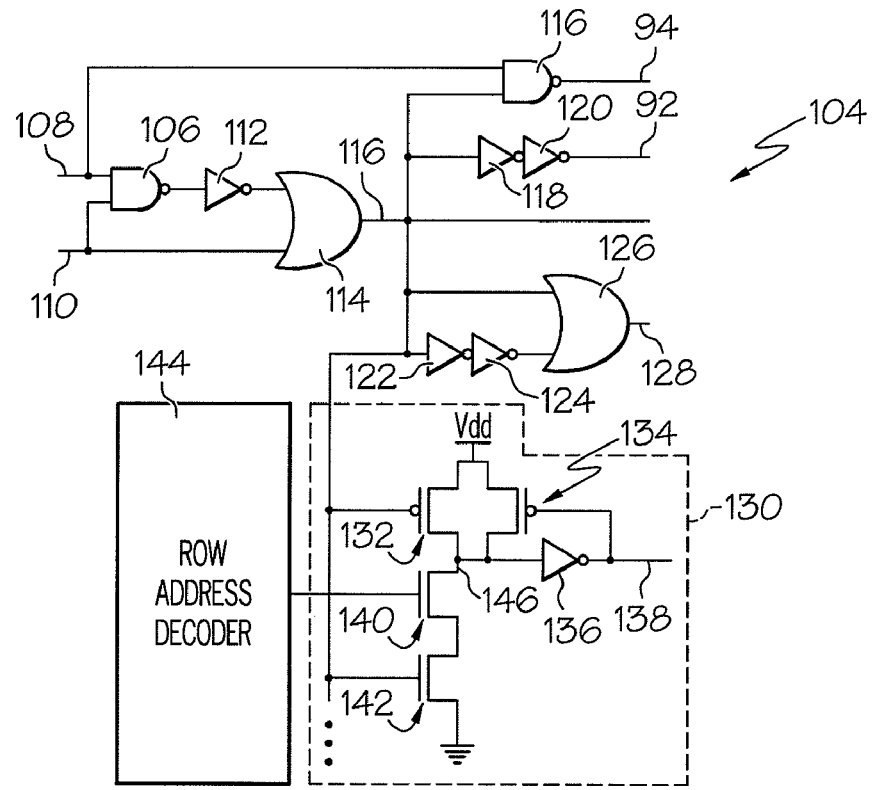
FIG. 5 is a schematic of an illustrative embodiment of a timing circuit.

FIG. 5 shows a circuit schematic of an illustrative timing circuit 104 responsible for providing various signals for each of the test circuits 18. In this illustrative configuration, NAND gate 106 includes inputs electrically connected to a READ test line 108 and a system clock line 110. READ test line 108 and enable line 64 are inversely related in this illustrative embodiment. The signal on READ test line 108 is high indicating a read operation is to occur and remains high for the read operation.

The output of gate 106 is electrically connected to an input of inverter 112 with the output of inverter 112 electrically connected to an input of OR gate 114. Another input of gate 114 is electrically connected to the system clock line 110. Output 116 of gate 114 provides a "local" clock signal. NAND gate 102 includes an input electrically connected to read signal 108 and another input electrically connected to output 116. The output of NAND gate 102 is second sense enable line 68, which provides an enable signal to sense amplifiers 52b of each test circuit 17.

The input of an inverter 118 is electrically connected to output 116 and the output of inverter 118 is electrically connected to the input of inverter 120. The output of inverter 120 is first sense enable line 66, which provides the enable signal to sense amplifiers 52a of each test circuit 17.

Inverter 122 has an input electrically connected to output 116 and an output electrically connected to an input of inverter 124. OR gate 126 has an input electrically connected to output 116 and another input electrically connected to the output of inverter 124. Output 128 of OR gate 126 provides a bit line pre-charge signal that, when "high," indicates to a circuit (not shown) responsible for initially charging the BIT lines and notBIT lines that the charging is complete.

Memory device 18 also includes a word line driver circuit 130, which generates signal for a particular WORD line, such as WORD line 20 shown in FIG. 3. In this illustrative embodiment, memory device 10 includes a number of circuits 130, having one for each memory address "row." Circuit 130 illustratively includes p-type transistors 132, 134, both having their respective source terminals electrically connected to Vdd. Drain terminals of transistors 132, 134 are electrically connected to the input of inverter 136. Output 138 of inverter 136 provides an enable signal for a particular WORD line. A gate terminal of transistor 132 is electrically connected to output 116 and a gate terminal of transistor 134 is electrically connected to output 138.

A source terminal of transistor 140 is electrically connected to the input of inverter 138 and drain terminals of transistors 132, 134. A gate terminal of transistor 140 is electrically connected to row address decoder 144, which provides a signal to turn on transistor 140 when the associated WORD line is desired to be enabled. Row address decoders are typically found in memory devices, such as memory device 10. A source terminal of transistor 142 is electrically connected to the drain terminal of transistor 140. A gate terminal of transistor 142 is electrically connected to output 116 and a drain terminal of transistor 142 is electrically connected to ground.

Figure 6:
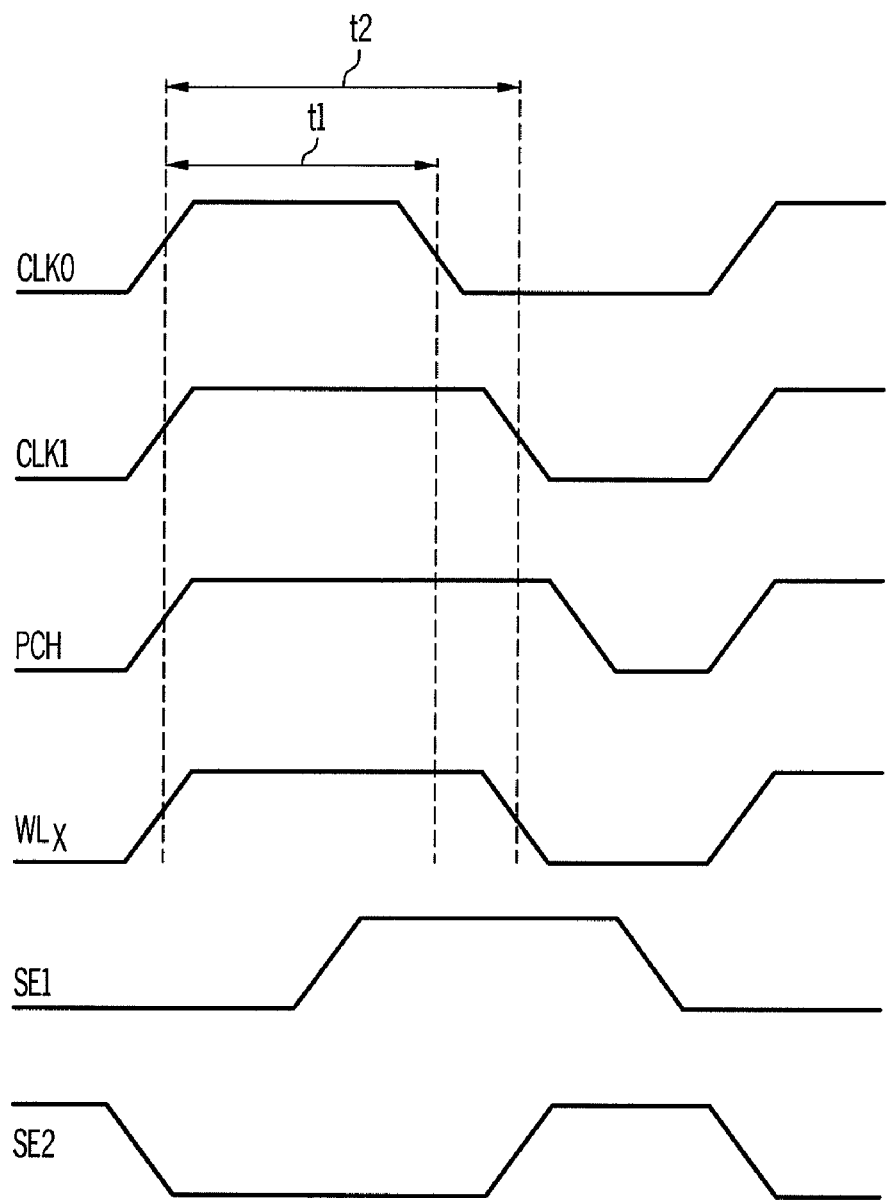
FIG. 6 is a schematic of an illustration of various waveforms of signals.

FIG. 6 shows the waveforms of various signals relative to one another in time during a read test cycle. Specifically, FIG. 6 illustratively shows the signals corresponding to various outputs and lines shown in FIG. 5 during typical operation. In particular, the signals shown correspond to the following: CLK0 represents the signal of line 110; CLK 1 represents the signal of output 116; PCH represents the signal of output 128; WLx represents the signal of output 138; SE1 represents the signal of first sense enable line 66; and SE2 represents the signal of second sense enable line 68. FIG. 6 also shows a comparison between times t1, t2, which illustrates that local clock signal CLK1 is extended beyond the system clock signal CLK0 in order for both sense amplifiers 52a-b of each test circuit 17 to each perform a read function at different points in time. The first enable line signal SE1 is illustrated as enabling a sense amplifier 52a before the second enable line signal SE2 enables a corresponding sense amplifier 52b.

Referring to FIGS. 1-6, during operation memory device 10 can be tested in order to determine if faults are occurring within the memory cells 12. Various types of memory cell faults can occur of that test circuit 17 can detect. In this illustrative embodiment, a read operation can occur with allows each memory cell 12 associated with a particular memory address "row" to be read. For example, the memory cell 12 associated with WORD line 20 and bit location 59 is accessed when WORD line 20 provides a logic high signal allowing access to memory cell 12. BIT line 14 and notBIT line 16 will communicate the memory cell 12 contents to the sense amplifiers 52a, 52b. As shown in FIG. 6, the signal SE1 on the first sense enable line 66 provides a logic high before the signal SE2 on the second sense enable line 68, which allows comparator 28 to compare the outputs of sense amplifiers 52a, 52b, which are the memory cell contents at two distinct points in time. Output 30 of comparator 28 provides a logic high when outputs 54a and 54b are different, which indicates a fault has occurred.

If a fault occurs resulting in "flipping" where the memory cell 12 contents flip such that the inverters 32, 34 of memory cell 12 incorrectly flip the voltages at nodes 48, 50, then transistors 58,60 can expedite the voltage change in bit lines 14, 16. This allows sense amplifier 52b to clearly detect the fault in time to compare against output 54a. For example, if BIT line 14 is at a higher voltage relative to notBIT line 16 when read by sense amplifier 52a, the memory cell 12 has node 48, 50 voltages of Vdd and substantially zero, respectively. If flipping occurs, such that the node 48, 50 voltages flip, then the bit line 14, 16 voltages need to communicate that the flipping has occurred. When the memory cells are to be read, line 64 provides a logic low, which turns on p-type transistor 62. This allows Vdd to be applied to source terminals of both transistor 58,60.

If the memory cell is storing node voltages 48, 50 of Vdd, zero correctly, sense amplifier 52a a will have a logic "0" at output 54a. This will turn on transistor 58 allowing Vdd to be applied to notBIT line 16. Because sense amplifier 52a has already performed a read operation, its output will not be affected. If flipping occurs such that Vdd would then be the correct notBIT line 16 voltage to represent the flipped memory cell 12 contents, Vdd applied to notBIT line 16 will raise the voltage on notBIT line 16. This will ensure sense amplifier 52b senses the flipping correctly.

When flipping does occur, such that sense amplifiers 52a-b each have different outputs, comparator 28 will then output a logic high, indicating an error has occurred. This indication will allow an appropriate course of action to be taken in dealing with the faulty memory cell 12.

In order to perform the "double-sensing" in allowing sense amplifiers 52a-b to each perform a read function at different points in time, the WORD line associated with a "row" of memory cells being read needs to provide a logic "1" for a duration allowing memory cells 12 to be accessed for an appropriate time. Timing circuit 104 described in FIG. 5 is used to accomplish the WORD line extensions.

The system clock line 110 and READ enable line 108 need to both provide a logic "1" in order to produce the signals allowing the "double-sensing" to take place. The lines 108, 110 will then cause output 116, the local clock line, to produce a logic high. This in turn will eventually cause the first and second sense enable lines 66, 68, respectively, to each produce a logic "1" to enable sense amplifiers 52a-b. Gates 102, 118, 120 are sized to produce the delay allowing the first sense enable line 66 to produce a logic high before second sense enable line 68 allowing the double-sensing to occur.

The signal at output 116 is also used to produce a WORD line enabling signal for a period long enough for the double-sensing to occur. FIG. 6 illustratively shows that when output 116 is low, or at a logic "0," p-type transistor 132 is turned on, which biases node 146 to a voltage of Vdd. N-type transistor 142 is off, which keeps node 146 at Vdd, which cause output 138 to be low, thus also turning on transistor 134. When output 116 provides a logic "1," transistor 132 is turned off, and transistor 142 is turned on. When the WORD line associated with word line driver circuit 130 is desired to be on, row address decoder 144 provides a logic high, turning on transistor 140. Node 146 is then isolated from Vdd, which is discharged through transistors 140, 142. The logic "0" provided to inverter 136 results in output 138 being a logic "1" allowing a WORD line to turn on access transistors 36, 38 of memory cells 12 associated with the particular WORD line.

Figure 7A:
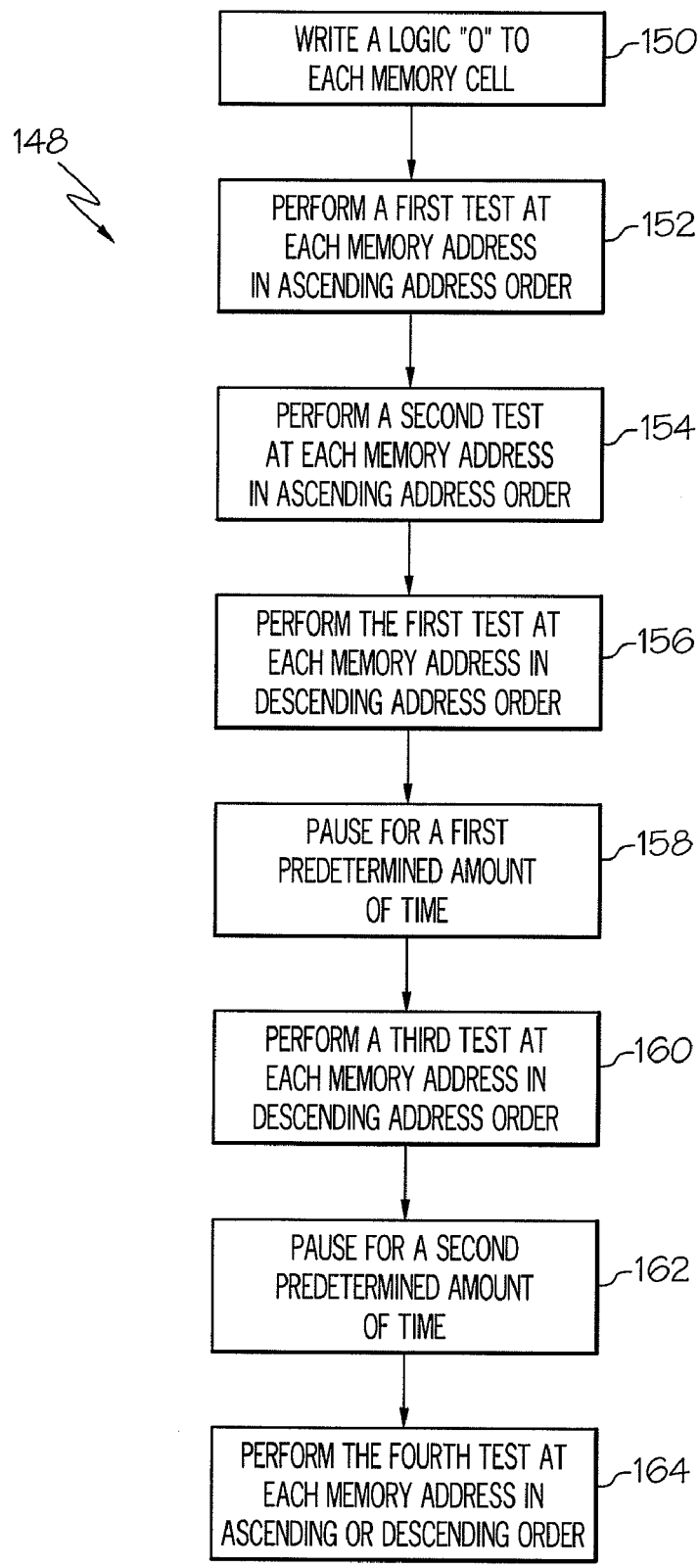
FIG. 7(*a*) is a representation of an illustrative embodiment of a memory device testing algorithm.

FIGS. 7(a) and (b) each show a test sequence that can be used to indicate a failure in a memory device, such as memory device 10, through indicating that a memory cell is faulty. Particularly, FIG. 7(a) illustratively shows a test sequence 148 having a number of operations for determining if a memory cell, such as memory cell 12, is faulty. In this illustrative embodiment operation 150 includes writing a logic "0" to the memory cells 12 associated with memory device 10.

Operation 152 includes performing a first test at each memory address in ascending address order. Memory addresses associated with each WORD line are typically indexed so that there is a "highest" and "lowest" memory address. In this illustrative embodiment, the first test of operation 152 can begin at the lowest memory address and continue to the highest memory address. In this illustrative embodiment, the first test may include reading the memory cells 12 having a common memory address. Each "read" of a memory cell 12 includes determining the contents of a memory cell 12 and indicating if the contents are other than that expected, thus indicating a fault. In this example, the read of operation 152 includes determining if the logic "0" written in operation 150 is contained in each memory cell 12. The reading may be performed with a single sense amplifier, such as sense amplifier 52. If a logic "0" is not found, then a fault has occurred and can be communicated accordingly. The first test may further include writing a logic "1" to the memory cell after the read is completed.

Operation 154 illustratively includes performing a second test at each memory address in a descending memory address order, i.e. highest address to lowest address. The second test may include reading each memory cell 12 having a common memory address, which as stated earlier includes determining if a logic "1" is contained and indicating if a logic "1" is not. The second test can also include writing a logic "0" to each memory cell sharing a common address. Test sequence 148 can also have an operation 156 that includes performing the first test in descending order. Test sequence 148 can also include operation 158, which includes pausing for a first predetermined time.

Operation 160 of test sequence 148, illustratively includes performing the first test in descending memory address order. The third test can include a first read of the memory cells 12 sharing a common memory address to determine if the memory cell content contains a logic "1" and indicating a present fault. The third test can also include a second read to again determine if a logic "1" is contained in memory cell 12 then a logic "0" can written be to each memory cell 12 sharing a common memory address. Test sequence 148 illustratively includes operation 162, which can include pausing for a second predetermined amount of time.

Test sequence 148 also illustratively includes operation 164, which can include a first reading the contents of memory cells 12 sharing a common memory address to determine if a logic "0" is contained therein and indicating otherwise. Operation 164 may also include a second reading of the memory cells 12 sharing a common memory address to determine if a logic "0" is contained therein and indicate if otherwise. Operation 164 can occur in ascending or descending order of memory addresses.

Test circuit 17 illustratively shown in FIG. 3 can be used with test sequence 148 for each read function. Each read function associated with test sequence 148 can be performed by test circuit 17, with output 30 providing the indication that a memory cell 12 does not contain the expected bit and a fault has occurred as described regarding FIG. 4. When test circuit 17 is used for test sequence 148, the back-to-back read functions of operations 164 and 160 may be reduced to a single read function.

Figure 7B:
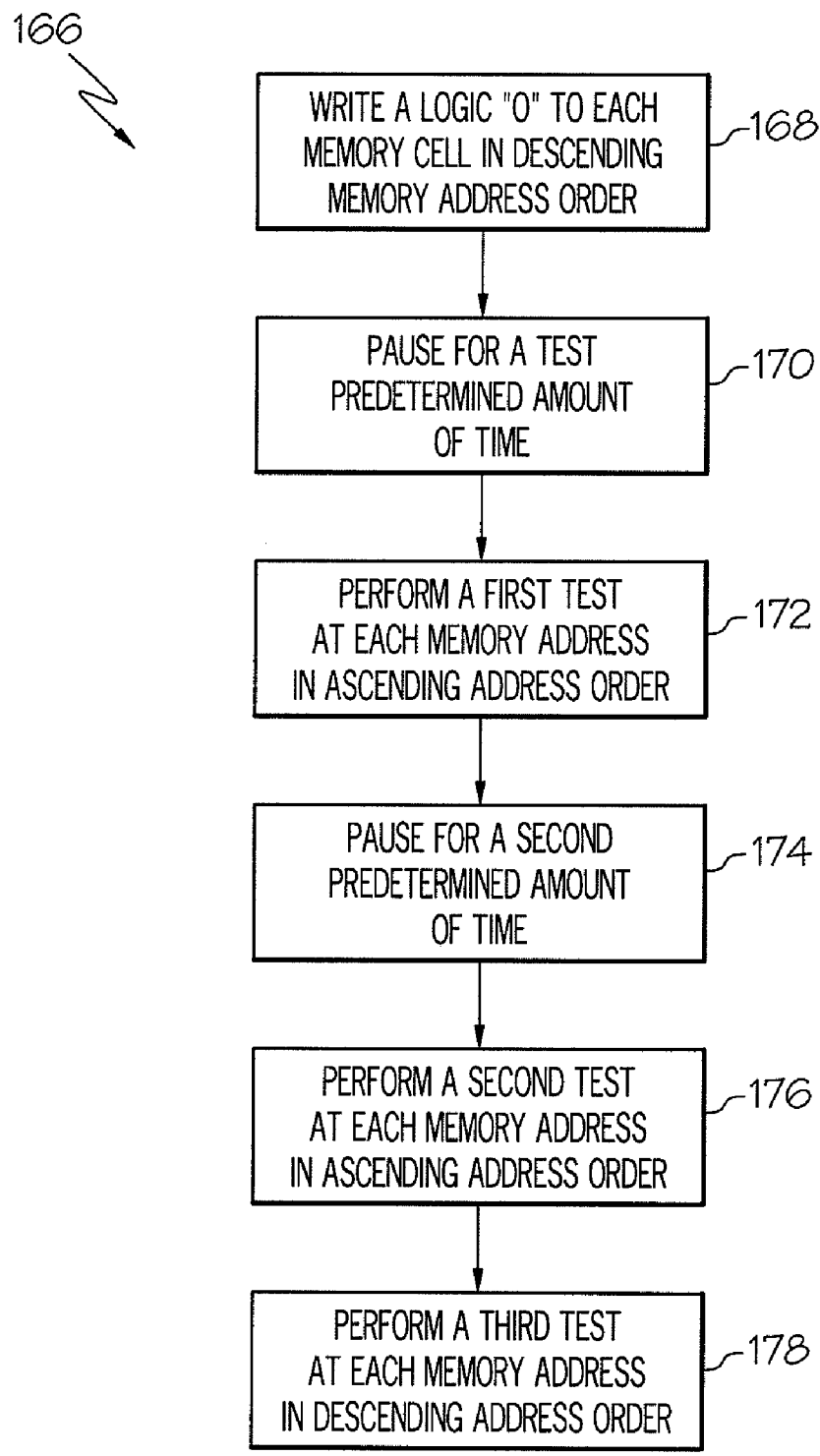

Another test sequence 106 is illustratively shown in FIG. 7(b) as including a number of operations 168-178. Test sequence 166 includes operation 168, which can include writing a logic "0" to each memory descending memory address order. Operation 170 can include pausing for a first predetermined amount of time.

Operation 172 includes performing a first test at each memory address in ascending address order. In this illustrative embodiment, the first test can include a first reading of the memory cells 12 having a common memory address to determine if a logic "0" is contained therein and indicating otherwise and subsequently writing a logic "0" then writing a logic "1." The first step can also include second reading of the memory cells 12 to determine if a logic "1" is contained therein and indicating otherwise.

Operation 174 may include pausing for a second predetermined amount of time. Operation 176 includes performing a second test as each memory address in ascending address order. The second test can include a first read to determine if a logic "0" is contained therein and indicate otherwise. Subsequently, a writing a logic "1" can be written to the memory cell contents and then a logic "0." The second test can further include a second read of the memory cells having a common memory address to determine if a logic "1" is contained therein and indicating otherwise.

Operation 178 includes performing a third test at each memory address in descending memory address order. The third test can include reading the contents of each memory cell 12 of a common memory address is contained therein and indicating otherwise.

The test sequences 148, 166 include several operations that are performed at each memory address in an ascending order or descending order of memory addresses. It is to be appreciated that the ascending/descending direction can be interchanged for each test sequence 148, 166 as long as all of the directions are consistently interchanged. Operations allowing either the ascending or descending order are unaffected by the interchange due to either direction being appropriate. It is also to be appreciated that other sequences may be used to traverse the memory addressees in order to access memory cells 12 for the appropriate action.

There are a plurality of advantages of the present disclosure arising from the various features of the methods, circuits, and devices described herein. It will be noted that alternative embodiments of the methods, circuits, and devices of the present disclosure may not include all of the features described yet still benefit from at least some of the advantages of such features. Those of ordinary skill in the art may readily devise their own implementations of the methods, circuits, and devices that incorporate one or more of the features of the present invention and fall within the spirit and scope of the present disclosure as defined by the appended claims.

What is claimed is:

1. A test circuit for determining a memory cell fault in a memory device, the test circuit comprising:
    a read circuit configured to read a memory cell and produce a first output indicative of memory cell content at a first time instant and a second output indicative of the memory cell content at a second time instant later than the first; and
    a comparator configured to receive and process the first and second outputs and to produce a signal indicative of whether a memory cell fault has occurred.

2. The test circuit of claim 1, wherein the read circuit comprises:
    a first sense amplifier having a first input electrically connected to a first bit line of the memory device, a second input electrically connected to a second bit line of the memory device, a third input configured to receive a first sense enable signal, a first output defining the first output of the read circuit, and a second output; and
    a second sense amplifier having a first input electrically connected to the first bit line, a second input electrically connected to the second bit line, a third input configured to receive a second sense enable signal, a first output defining the second output of the read circuit, and a second output.

3. The test circuit of claim 2, wherein the read circuit further comprises:
    a voltage source;
    a first transistor having a first input electrically connected to the voltage source, a second input configured to receive a read signal indicating a memory cell is to be read, and an output;
    a second transistor having a first input electrically connected to the output of the first transistor, a second input electrically connected to the first output of the first sense amplifier, and an output connected to the first bit line; and
    a third transistor having a first input electrically connected to the output of the first transistor, a second input electrically connected to the second output of the first sense amplifier, and an output connected to the second bit line.

4. The test circuit of claim 3, wherein the first, second, and third transistors are p-type transistors.

5. The test circuit of claim 3, further comprising a timing circuit configured to produce the first sense enable signal and the second sense enable signal.

6. The test circuit of claim 5, wherein the timing circuit comprises:
    a first NAND gate having a first input configured to receive the enable signal indicating a memory cell is to be read, a second input configured to receive a clock signal, and an output;
    an first inverter having a first input electrically connected to the output of the first NAND gate and an output; and
    a first OR gate having a first input electrically connected to the output of the first inverter, a second input configured to receive the clock signal, and an output.

7. The test circuit of claim 6, wherein the timing circuit further comprises:
    a second inverter gate having an input electrically connected to the output of the first OR gate and an output;
    a third inverter having an input electrically connected to the output of the second inverter and an output configured to produce the first sense enable signal; and
    a second NAND gate having a first input configured for receiving the read signal, a second input electrically connected to the output of the first OR gate, and an output configured to produce the second sense amplifier enable signal.

8. The test circuit of claim 6, wherein the timing circuit further comprises:
    a third inverter having an input electrically connected to the output of the first OR gate and an output; and
    a fourth inverter having an input electrically connected to the output of the third inverter and an output configured to produce a signal indicating that the first and second bit lines are to be charged to a predetermined voltage.

9. The test circuit of claim 3, wherein the comparator comprises:
    a first inverter having an input defined as the first input of the comparator and an output;
    a second inverter having an input defined as the second input of the comparator and an output; and
    an XOR gate having a first input electrically connected to the output of the first inverter, a second input electrically connected to the output of the second inverter, and an output configured to generate the signal indicative of a memory cell fault occurring.

10. A static random access memory (SRAM) device comprising:

a number of memory cells configured to each store bit data content and each being identified by a particular memory address and bit location;

a number of bit lines, each bit line corresponding to a particular bit location;

a number of word lines, each word line corresponding to a particular memory address; and a number of test circuits, each test circuit configured to determine a memory cell fault at a particular bit location and each test circuit comprising:

a read circuit configured to read a memory cell and produce a first output indicative of memory cell content at a first time instant and a second output indicative of the memory cell content at a second time instant later than the first; and a comparator configured to receive and process the first and second outputs and to produce a signal indicative of whether a memory cell fault has occurred.

11. The SRAM device of claim 10, wherein each test circuit further comprises:

a first sense amplifier having a first input electrically connected to a first bit line of a corresponding bit location, a second input electrically connected to a second bit line of a corresponding bit location, a third input configured to receive a first sense enable signal, a first output defining the first output of the read circuit, and a second output; and a second sense amplifier having a first input electrically connected to the first bit line of the corresponding bit location, a second input electrically connected to the second bit line of the corresponding bit location, a third input configured to receive a second sense enable signal, a first output defining the second output of the read circuit, and a second output.

12. The SRAM device of claim 11, wherein each test circuit further comprises:

a first transistor having a first input electrically connected to the first output of the first sense amplifier, a second input, and an output electrically connected to the first bit line of the corresponding bit location; and a second transistor having a first input electrically connected to the second output of the first sense amplifier, a second input, and an output electrically connected to the second bit line of the corresponding bit location.

13. The SRAM device of claim 12, further comprising:

a voltage source; and a third transistor having a first input electrically connected to the voltage source, a second input configured to receive a read signal indicating a memory cell is to be read, and an output electrically connected to the second inputs of the first and second transistors of each test circuit.

14. The test circuit of claim 13, wherein the first, second, and third transistors are p-type transistors.

15. The SRAM device of claim 13, further comprising a timing circuit configured to provide the first sense amplifier enable signal, the second sense amplifier enable signal, and a word line enable signal.

16. The SRAM device of claim 15, wherein the timing circuit further comprises:

a first NAND gate having a first input configured to receive the read signal a second input configured to receive a clock signal, and an output;

a first inverter having a first input electrically connected to the output of the first NAND gate and an output; and a first OR gate having a first input electrically connected to the output of the first inverter, a second input configured for receiving a clock signal, and an output.

17. The SRAM device of claim 16, wherein the timing circuit further comprises:

a second inverter having an input electrically connected to the output of the first OR gate and an output;

a third inverter having an input electrically connected to the output of the second inverter and an output configured to generate the first sense enable signal; and a second NAND gate having a first input configured for receiving the enable signal, a second input electrically connected to the output of the first OR gate, and an output configured to generate the second sense amplifier enable signal.

18. The SRAM device of claim 17, further comprising:

a number of word line driver circuits, each word line driver circuit corresponding to a particular memory address and each word line driver circuit comprising:.

a voltage source;

a first transistor having a first input electrically connected to the voltage source, a second input configured to receive the clock signal, and an output;

a second transistor having a first input electrically connected to the voltage source, a second input, and an output;

a third transistor having a first input electrically connected to the output of the first transistor and the output of the second transistor, a second input configured to receive the a signal indicating a particular memory address is to be read, and an output;

a fourth transistor having a first input electrically connected to the output of the third transistor, a second input configured to receive the local clock signal, and an output electrically connected to ground; and a first inverter having an input electrically connected to the output of the first transistor, the output of the second transistor, and the first input of the third transistor and an output electrically connected to the second input of the second transistor and configured to provided a word line enable signal for a particular memory address.

19. The SRAM device of claim 10, wherein the comparator of each test circuit comprises:

a first inverter having an input defined as the first input of the comparator and an output;

a second inverter having an input defined as a the second input of the comparator and an output; and an XOR gate having a first input electrically connected to the output of the first inverter, a second input electrically connected to the output of the second inverter, and an output configured to generate the signal indicative of a memory cell fault occurring.

* * * * *